United States Patent
Qawami et al.

(10) Patent No.: US 7,345,914 B2
(45) Date of Patent: Mar. 18, 2008

(54) USE OF FLASH MEMORY BLOCKS OUTSIDE OF THE MAIN FLASH MEMORY ARRAY

(75) Inventors: Shekoufeh Qawami, El Dorado Hills, CA (US); Lance W. Dover, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 102 days.

(21) Appl. No.: 11/317,951

(22) Filed: Dec. 22, 2005

(65) Prior Publication Data

US 2007/0147116 A1 Jun. 28, 2007

(51) Int. Cl.
*G11C 11/34* (2006.01)
(52) U.S. Cl. .................. 365/185.11; 365/185.03; 365/185.33
(58) Field of Classification Search ........... 365/185.11, 365/185.03, 185.33, 185.28
See application file for complete search history.

(56) References Cited

U.S. PATENT DOCUMENTS

| | | | |
|---|---|---|---|
| 5,577,221 A * | 11/1996 | Liu et al. .................. 711/100 |
| 6,031,757 A * | 2/2000 | Chuang et al. ......... 365/185.04 |
| 6,353,553 B1 * | 3/2002 | Tamada et al. ......... 365/185.03 |
| 6,510,081 B2 * | 1/2003 | Blyth et al. ............ 365/185.12 |
| 6,590,808 B1 * | 7/2003 | Yamada et al. ........ 365/185.03 |
| 6,728,133 B2 * | 4/2004 | Shimizu ................. 365/185.03 |

* cited by examiner

*Primary Examiner*—Anh Phung
*Assistant Examiner*—Dang Nguyen
(74) *Attorney, Agent, or Firm*—Derek J. Reynolds; Intel Corporation

(57) ABSTRACT

A method, device, and system are disclosed. In one embodiment, the device comprises an array of flash memory blocks to store information in a multiple bit per cell mode, one or more flash memory blocks external to the array to store information in a single bit per cell mode, and a memory controller capable of allowing access to the array and the one or more flash memory blocks external to the array.

18 Claims, 4 Drawing Sheets

USE OF FLASH MEMORY BLOCKS OUTSIDE OF THE MAIN FLASH MEMORY ARRAY

FIELD OF THE INVENTION

The invention relates to flash memory. More specifically, the invention relates to use of blocks of flash memory outside of the main flash memory array for small parameter storage.

BACKGROUND OF THE INVENTION

In today's flash memory applications, small flash array blocks are beneficial. Some of the benefits include storing specific information such as tuning parameters and phone IDs, etc in cell phone applications, preserving boot up code, and continuously writing real-time parameters such as a call timer in a cell phone.

This data is often frequently updated, but it is usually not large in size. Using large flash memory blocks to store this data can often waste significant amounts of space. Thus, using small blocks potentially can save significant storage space. Furthermore, small blocks are beneficial in high cycle applications because of the faster erase time.

Having small blocks within a flash array will cause the array not to be symmetric. Even if small blocks are used within a main array, making it asymmetric, different technology manufacturers that utilize flash memory have different requirements when it comes to the location of the small blocks in a memory array. Some require these small blocks to be at top of the array address space and some require them to be at the bottom of the array address space. Loading boot code for a device is an example of a potential bottom of the array location requirement. Thus, sometimes it is necessary to have two types of configurations in flash memory devices—top boot and bottom boot.

Removing the small blocks from the array allows the array to be symmetrical, but if the small blocks are removed completely, performance is lost for frequently updated data requirements and the storage of small amounts of data becomes less efficient.

DESCRIPTION OF THE DRAWINGS

The present invention is illustrated by way of example and is not limited by the figures of the accompanying drawings, in which like references indicate similar elements, and in which.

DETAILED DESCRIPTION OF THE INVENTION

Embodiments of a method, device, and system for use of flash memory blocks outside of the main flash memory array for small parameter storage, and accessing them by overlaying the blocks on the main array address space are disclosed. In the following description, numerous specific details are set forth. However, it is understood that embodiments may be practiced without these specific details. In other instances, well-known elements, specifications, and protocols have not been discussed in detail in order to avoid obscuring the present invention.

Figure 1:
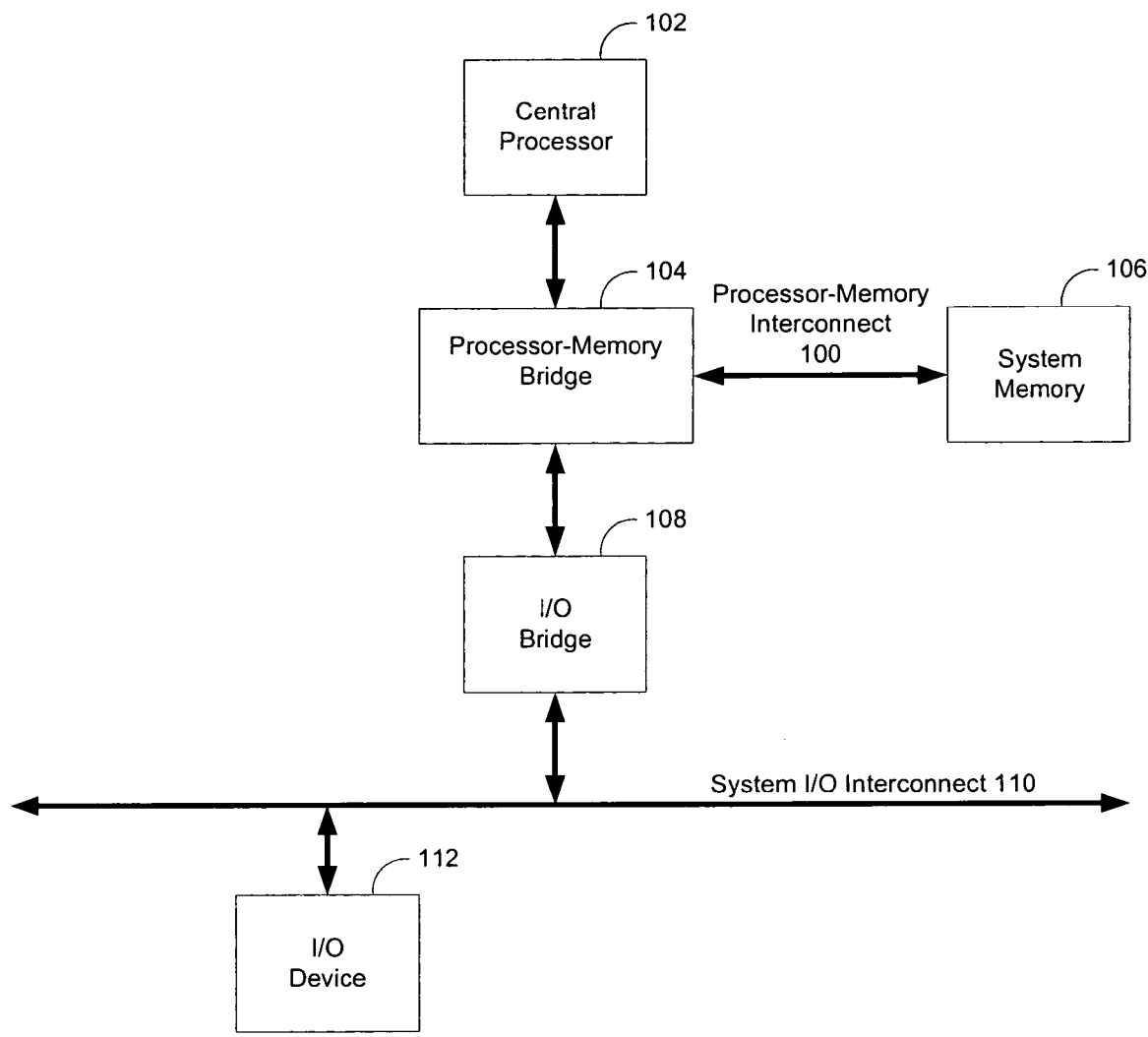
FIG. 1 is a block diagram of a computer system which may be used with embodiments of the present invention.

FIG. 1 is a block diagram of a computer system which may be used with embodiments of the present invention. The computer system comprises a processor-memory interconnect 100 for communication between different agents coupled to interconnect 100, such as processors, bridges, memory devices, etc. Processor-memory interconnect 100 includes specific interconnect lines that send arbitration, address, data, and control information (not shown). In one embodiment, central processor 102 is coupled to processor-memory interconnect 100 through processor-memory bridge 104. In another embodiment, there are multiple central processors coupled to processor-memory interconnect (multiple processors are not shown in this figure).

Processor-memory interconnect 100 provides the central processor 102 and other devices access to the memory subsystem. In one embodiment, a system memory controller that controls access to system memory 106 is located on the same chip as processor-memory bridge 104. In another embodiment, a system memory controller is located on the same chip as central processor 102. Information, instructions, and other data may be stored in system memory 106 for use by central processor 102 as well as many other potential devices.

I/O devices, such as I/O device 112, are coupled to system I/O interconnect 110 and to processor-memory interconnect 100 through I/O bridge 108 and processor-memory bridge 104. I/O Bridge 108 is coupled to processor-memory interconnect 100 (through processor-memory bridge 104) and system I/O interconnect 110 to provide an interface for a device on one interconnect to communicate with a device on the other interconnect.

Figure 2:
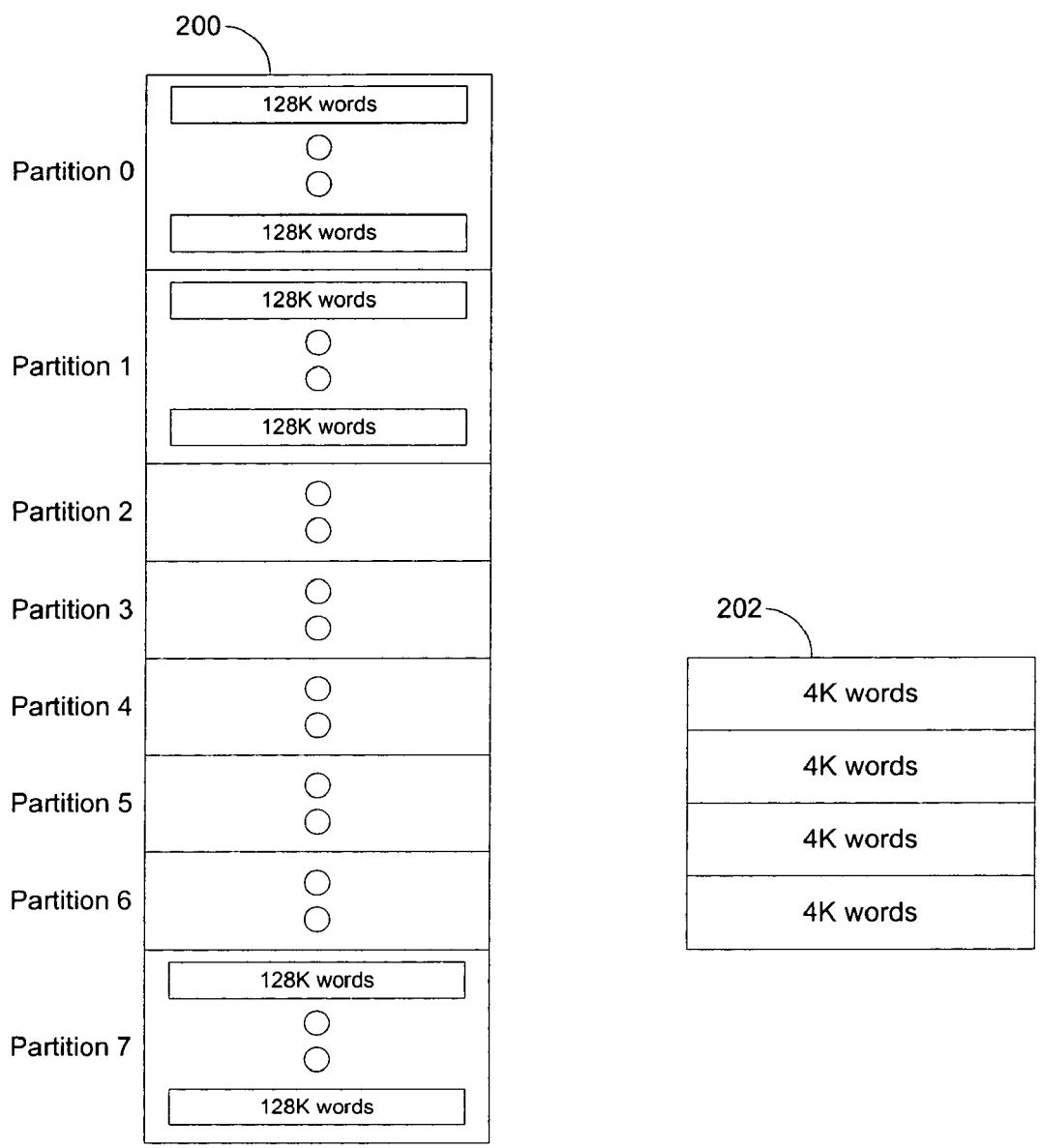
FIG. 2 illustrates one embodiment of the structure of the flash memory in more detail.

In one embodiment, system memory 106 is flash memory. Flash memory is non-volatile memory and thus is able to have data stored without constant applied power. FIG. 2 illustrates one embodiment of the structure of the flash memory in more detail. In this embodiment, the flash memory is comprised of a flash memory array 200 and an extended flash array 202.

The flash memory array 200 is divided into eight symmetric partitions. Each of the partitions is made up of a number of 128 k word blocks. Each of the blocks consist of a plurality of individual memory cells. Additionally, in this embodiment, the flash memory array 200 has multilevel memory cells. Multilevel memory cells are used to increase the storage capacity of the flash memory array 200. In this embodiment, the flash memory array 200 stores two bits in each cell in the array. In other embodiments, the flash memory array 200 may store more or less than two bits in each cell in the array.

In this embodiment, the individual memory cells within the extended flash array (EFA) 202 store one bit per cell. Furthermore, in this embodiment, the EFA 202 includes is constructed of four 4 k word blocks. Thus, the storage capacity within the EFA is 16 k words of data. The discrete nature of the EFA 202 apart from the flash memory array 200 allows the flash memory array 200 to remain symmetrical. Moreover, single bit per cell memory, although not as economical per unit storage, generally performs high cycles writes and fast erases faster than multi bit per cell memory. In other embodiments, the size and number of the blocks within the EFA 202, as well as the number of bits per cell, can increase or decrease depending upon system needs.

In one embodiment, all standard read, write, erase, and lock commands directed to flash memory do not change their functionality. Thus, when a standard command is issued, the command accesses the main flash array 200. In one embodiment, four EFA-specific commands are utilized for memory accesses within the EFA 202. In this embodiment, the blocks in the EFA 202 can be accessed through special EFA read, write, erase, and lock commands. A program or device wanting access to one or more blocks within the EFA 202 issues an EFA command with an address. The entire set of blocks that make up the EFA are then mapped into the addressed partition in the main flash array 200 starting at address 0 in that partition. This process is shown more specifically in FIG. 3.

Figure 3:
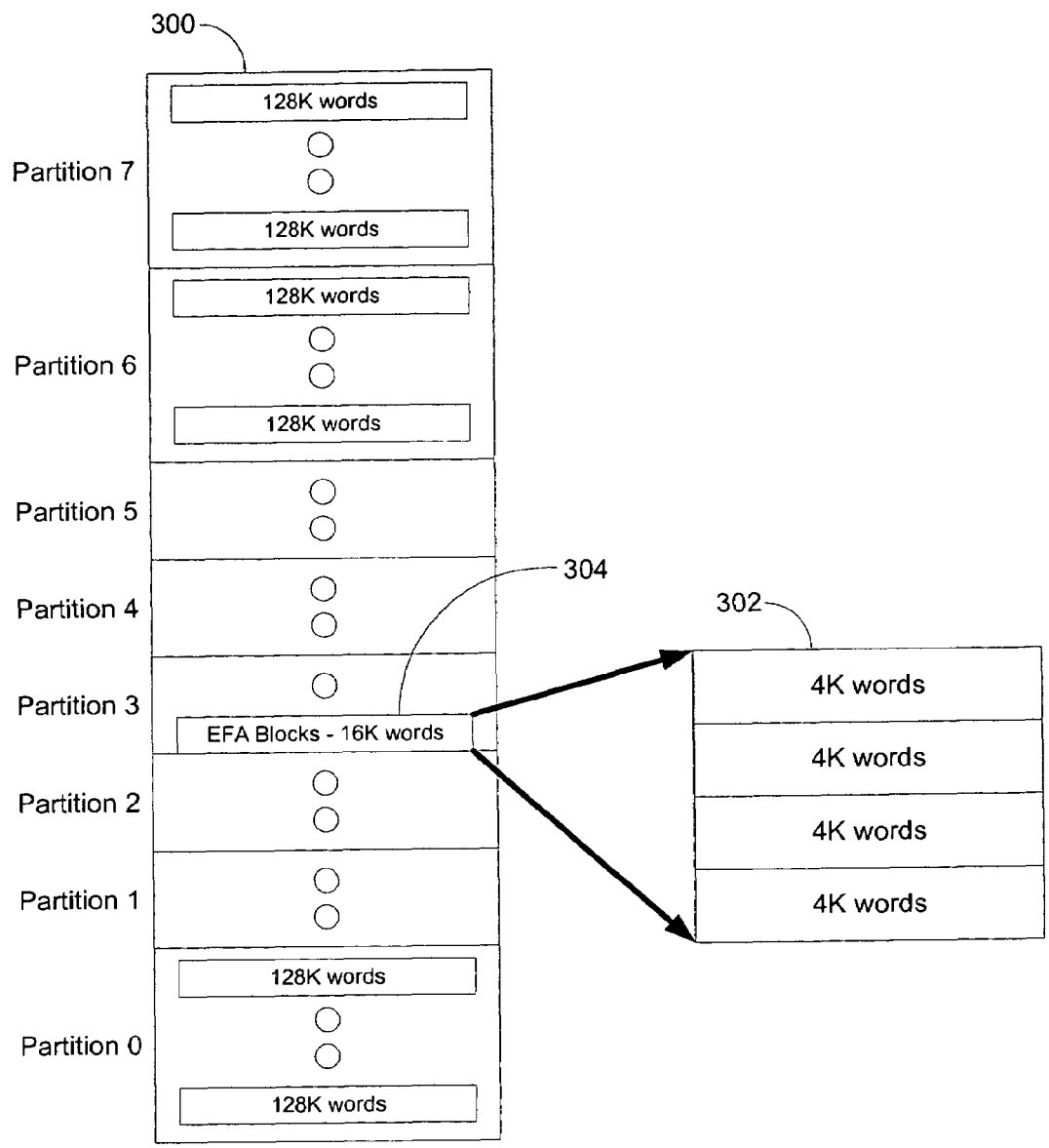
FIG. 3 illustrates one embodiment of an extended flash array-main flash array address mapping scheme.

FIG. 3 illustrates one embodiment of an extended flash array-main flash array address mapping scheme. In this embodiment, an EFA command is issued with an address located within partition 4 in the main flash array 300. As a result of this command, all four EFA blocks 302 are mapped into the bottom 16 k word address locations at the start of partition 4 (304). Any subsequent access to this 16 k word address region within partition 4 of the main flash array during the following bus cycle automatically accesses the EFA blocks. In one embodiment, if an EFA command is issued outside of the mapped EFA address region, an error bit in a flash status register will result. In another embodiment, if the EFA command is issued outside of the mapped EFA address region, that command will be ignored.

In one embodiment, the EFA address region is mapped into the main flash array address space only for the bus cycle following the EFA command that initiated the mapping process. In another embodiment, the EFA region is mapped into the main flash array address space until an additional command is issued to remove the EFA address mapping and return the main flash array address space to its normal mode. In one embodiment, the memory controller that controls access to the flash memory performs the mapping process based on the EFA and non-EFA commands it receives from other devices and software applications.

Figure 4:
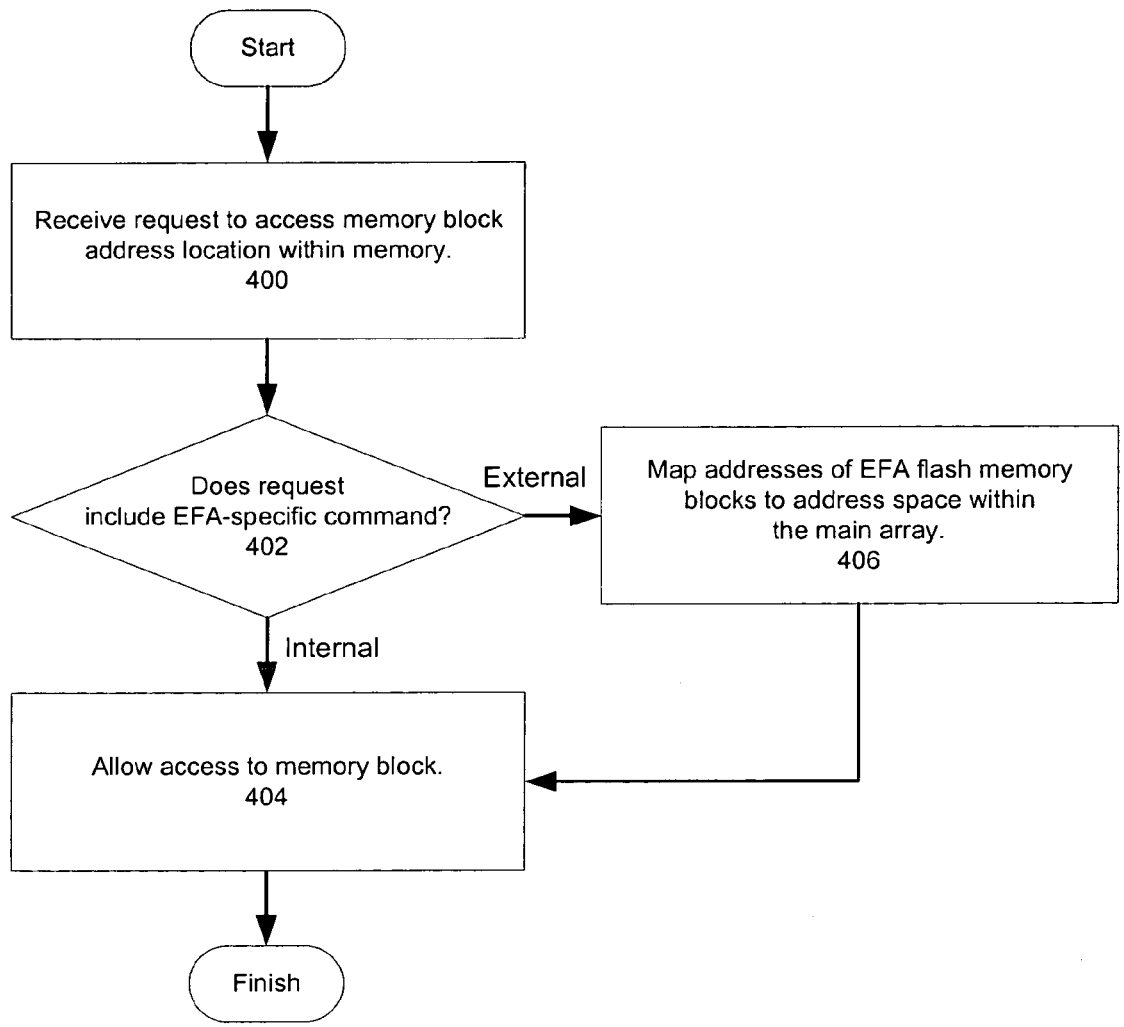
FIG. 4 is a flow diagram of an embodiment of a method to use flash memory blocks outside of the main flash memory array and accessing them by overlaying the blocks on the main array address space.

Now turning to the next figure, FIG. 4 is a flow diagram of an embodiment of a method to use flash memory blocks outside of the main flash memory array and accessing them by overlaying the blocks on the main array address space. The process is performed by processing logic that may comprise hardware (circuitry, dedicated logic, etc.), software (such as is run on a general purpose computer system or a dedicated machine), or a combination of both. In one embodiment, the processing logic is located within a flash memory microcontroller. The process begins by processing logic receiving a request to access a memory block address location within a memory device (processing block 400). In one embodiment, the memory device includes a main array of flash memory blocks. The main array stores information in a multiple bit per cell mode. Furthermore, the memory device also has one or more flash memory blocks in an external flash array (EFA). The memory blocks that are external to the array within the EFA store information in a single bit per cell mode. In different embodiments, the request to access memory could be a read request, write request, erase request, lock request, etc.

Next, processing logic determines whether the request includes a command that is specific to the EFA (processing block 402). In one embodiment, there are four commands that are specific to the EFA: read, write, erase, and lock commands. When one of these four commands is issued to the flash memory controller to access a location within the EFA, if it is determined that none of the EFA commands was issued, then processing logic allows access to the memory block because the memory block is in the main flash array (processing block 404) and the process is finished.

Otherwise, if it is determined that one of these four EFA commands was issued, then processing logic maps the addresses of the flash memory blocks within the EFA to address space within the main flash array (processing block 406). Once the addresses of the flash memory blocks within the EFA have been successfully mapped to a region of the main flash array then processing logic allows access to the memory block (processing block 404) and the process is finished.

Embodiments of a method, device, and system for use of flash memory blocks outside of the main flash memory array for small parameter storage, and accessing them by overlaying the blocks on the main array address space are disclosed. These embodiments have been described with reference to specific exemplary embodiments thereof. It will be evident to persons having the benefit of this disclosure that various modifications and changes may be made to these embodiments without departing from the broader spirit and scope of the embodiments described herein. The specification and drawings are, accordingly, to be regarded in an illustrative rather than a restrictive sense.

What is claimed is:

1. A memory device, comprising:
   a main array of flash memory blocks to store information in a multiple bit per cell mode;
   one or more flash memory blocks in an external flash array (EFA) to store information in a single bit per cell mode; and
   a memory controller operable to
      receive a request to access a memory block address location, wherein the address location is within one of the array of flash memory blocks and the one or more flash memory blocks external to the array;
      when the request does not include an EFA-specific command, allow access to the memory block; and
      when the request includes an EFA-specific command, map the addresses of the one or more flash memory blocks in the EFA to address space within the main array and subsequently allow access to the memory block.

2. The memory device of claim 1, wherein allowing access further comprises allowing a read, write, erase, or lock command to access one or more address locations in the main array or one or more address locations in the flash memory blocks in the EFA.

3. The memory device of claim 2, wherein the memory controller maintains an array address space that corresponds to the address locations of the flash memory blocks in the main array.

4. The memory device of claim 3, wherein the memory controller is further operable to map the address locations of the one or more flash memory blocks in the EFA to at least a portion of the array address space.

5. The memory device of claim 4, wherein the memory controller performs the mapping subsequent to the arrival of a read, write, erase, or lock command request to a location in a memory block in the EFA.

6. The memory device of claim 1, wherein the main array is symmetrical.

7. The memory device of claim 1, wherein the memory blocks in the EFA comprise four 4 Kbyte blocks.

8. The memory device of claim 1, wherein the memory blocks in the main array comprise a plurality of 128 Kbyte blocks.

9. The memory device of claim 5, wherein the main array comprises a plurality of partitions, each partition comprising one or more memory blocks.

10. The memory device of claim 9, wherein the memory controller maps the address locations of the one or more flash memory blocks in the EFA to the beginning address of a partition in the main array.

11. A method, comprising:
receiving a request to access a memory block address location within a memory device, the memory device consisting of a main array of flash memory blocks to store information in a multiple bit per cell mode and one or more flash memory blocks in an external flash array (EFA) to store information in a single bit per cell mode;
if the request does not include an EFA-specific command, allowing access to the memory block; and
if the request includes an EFA-specific command, mapping the addresses of the one or more flash memory blocks in the EFA to address space within the main array and subsequently allowing access to the memory block.

12. The method of claim 11, wherein the request comprises a read, write, erase, or lock command.

13. The method of claim 12, wherein the array comprises one or more partitions, each partition comprising one or more memory blocks.

14. A system, comprising:
a bus;
a processor coupled to the bus;
a network interface device coupled to the bus;
a memory device, coupled to the bus, comprised of:
a main array of flash memory blocks to store information in a multiple bit per cell mode;
one or more flash memory blocks in an external flash array (EFA) to store information in a single bit per cell mode; and
a memory controller operable to
receive a request to access a memory block address location, wherein the address location is within one of the array of flash memory blocks and the one or more flash memory blocks external to the array;
when the request does not include an EFA-specific command, allow access to the memory block; and
when the request includes an EFA-specific command, map the addresses of the one or more flash memory blocks in the EFA to address space within the main array and subsequently allow access to the memory block.

15. The system of claim 14, wherein allowing access further comprises allowing a read, write, erase, or lock command to access one or more address locations in the main array or one or more address locations in the flash memory blocks in the EFA.

16. The system of claim 15, wherein the memory controller maintains an array address space that corresponds to the address locations of the flash memory blocks in the main array.

17. The system of claim 16, wherein the memory controller is further operable to map the address locations of the one or more flash memory blocks in the EFA to at least a portion of the array address space.

18. The system of claim 17, wherein the memory controller performs the mapping subsequent to the arrival of a read, write, erase, or lock command request to a location in a memory block in the EFA.

* * * * *